(12) United States Patent
Lewis

(10) Patent No.: US 7,459,932 B1
(45) Date of Patent: Dec. 2, 2008

(54) PROGRAMMABLE LOGIC DEVICE HAVING LOGIC MODULES WITH IMPROVED REGISTER CAPABILITIES

(75) Inventor: David Lewis, Toronto (CA)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 11/753,059

(22) Filed: May 24, 2007

(51) Int. Cl.
H03K 19/173 (2006.01)
(52) U.S. Cl. .......................................... 326/38; 326/41
(58) Field of Classification Search ............. 326/37–41, 326/46
See application file for complete search history.

(56) References Cited

U.S. PATENT DOCUMENTS

| | | | | |
|---|---|---|---|---|
| 5,744,981 | A * | 4/1998 | Sasaki et al. .................. | 326/48 |
| 6,107,827 | A * | 8/2000 | Young et al. .................. | 326/41 |
| 6,943,580 | B2 | 9/2005 | Lewis et al. | |
| 7,129,747 | B1 * | 10/2006 | Jang et al. ..................... | 326/38 |
| 7,167,022 | B1 | 1/2007 | Schleicher et al. | |
| 7,185,035 | B1 | 2/2007 | Lewis | |
| 7,268,584 | B1 | 9/2007 | Cashman et al. .............. | 326/39 |
| 7,274,214 | B1 | 9/2007 | Young ......................... | 326/41 |
| 2007/0063732 | A1 | 3/2007 | Kaptanoglu et al. ........... | 326/40 |

OTHER PUBLICATIONS

"Stratix III Device Family Overview," pp. 1-1 through 1-16, from the Altera Corporation "Stratix III Device Handbook", vol. 1, Version 1, Nov. 2006.

Hutton et al., U.S. Appl. No. 11/486,164 entitled "Programmable Logic Device Having Logic Elements With Dedicated Hardware to Configure Look Up Tables as Registers" filed Jul. 12, 2006.

Hutton, U.S. Appl. No. 11/751,392 entitled "A Programmable Logic Device Having Complex Logic Blocks With Improved Logic Cell Functionality" filed May 21, 2007.

(Continued)

Primary Examiner—Don P Le
(74) Attorney, Agent, or Firm—Weaver Austin Villeneuve Sampson LLP

(57) ABSTRACT

A PLD that has more flip flops per logic module by providing more registered outputs than combinational outputs; and/or a combinational output that can drive more than one register is disclosed. The PLD includes a plurality of logic array blocks arranged in an array and a plurality of inter-logic array block lines interconnecting the logic array blocks of the array. At least one of the logic array blocks includes at least one logic module that includes a first combinational element configured to generate a first combinational output signal in response to inputs provided to the one logic module, a first register capable of being driven by the first combinational output signal and a second register capable of being driven by the first combinational output signal. The logic module therefore has more registered outputs than combinational outputs and a combinational output that can drive more then one output register. In alternative embodiments, the logic module may have one or more combinational element configured to generate one or more combinational output signals in response to inputs provided to the one logic module and a plurality of registers capable of being driven by the one or more combinational outputs signals. In these alternative embodiments, the number of registers exceeds the number of combinational output signals in the one logic module.

30 Claims, 5 Drawing Sheets

OTHER PUBLICATIONS

USPTO Notice of Allowance and Fee(s) Due mailed Feb. 25, 2008 in related U.S. Appl. No. 11/751,392 (9 pages).

USPTO Supplemental Notice of Allowability mailed May 15, 2008 in related U.S. Appl. No. 11/751,392 (3 pages).

Baeckler et al., "Logic Cell Supporting Addition of Three Binary Words," U.S. Appl. No. 10/718,968, filed Nov. 21, 2003.

Hutton et al., "Method and Apparatus for Implementing Additional Registers in Field Programmable Gate Arrays to Reduce Design Size," U.S. Appl. No. 11/328,407, filed Jan. 9, 2006.

Schleicher et al., "Omnibus Logic Element," U.S. Appl. No. 11/607,171, filed Dec. 1, 2006.

Virtex-5 User Guide, UG190 (v3.0) Feb. 2, 2007, downloaded from www.xilinx.com.

* cited by examiner

PROGRAMMABLE LOGIC DEVICE HAVING LOGIC MODULES WITH IMPROVED REGISTER CAPABILITIES

BACKGROUND

1. Field of the Invention

The present invention generally relates to Programmable Logic Devices (PLDs), and more particularly, to PLDs with logic modules having more registered outputs than combinational outputs; and/or a combinational output that can drive more than one output register.

2. Description of Related Art

A Programmable Logic Device (PLD) is a semiconductor integrated circuit that contains fixed logic circuitry that can be programmed to perform a host of logic functions. In the semiconductor industry, PLDs are becoming increasingly popular for a number of reasons. Due to the advances of chip manufacturing technology, application specific integrated circuits (ASICs) designs have become incredibly complex. This complexity not only adds to design costs, but also the duration of time needed to develop an application specific design. To compound this problem, product life cycles are shrinking rapidly. As a result, it is often not feasible for original equipment manufacturers (OEMs) to design and use ASICs. OEMs are therefore relying more and more on PLDs. The same advances in fabrication technology have also resulted in PLDs with improved density and speed performance. Sophisticated programming software enables complex logic functions to be rapidly developed for PLDs. Furthermore, logic designs generally can also be easily migrated from one generation of PLDs to the next, further reducing product development times. The closing of the price-performance gap with ASICs, and reduced product development times, makes the use of PLDs compelling for many OEMs.

The architecture of most PLDs defines a two-dimensional array of logic blocks. Row and column inter-logic block lines, typically of varying length and speed, provide signal and clock interconnects between the blocks of logic in the array. The blocks of logic are often referred to by various names, for example as Logic Array Blocks or LABs by the Altera Corporation, assignee of the present application, or Complex Logic Blocks (CLBs), as used by Xilinx Corporation. In the Altera architectures, the LABs are further broken into a plurality of individual logic elements, typically referred to as either Logic Elements (LEs) or Adaptive Logic Modules (ALMs). With the Xilinx architecture, the CLBs also include a group of logic elements called Logic Cells or (LCs). The LEs, LCs, or ALMS each typically include such elements as look up tables (LUTs), registers for generating registered outputs, adders and other circuitry to implement various logic and arithmetic functions. For the sake of simplicity, any module of logic, regardless of referring to an LE, an ALM, or a LC, will hereafter be generically referred to as a "logic module". Similarly, any block of logic, whether a LAB or a CLB, is hereafter generically referred to as a "logic array block". In no way should the terms "logic module" or "logic array block" be construed as limiting the present invention to a particular PLD architecture and is intended to cover any PLD architecture that uses any type of module of logic grouped into a logic array block, including but not limited to the PLDs offered by Altera and Xilinx.

Historically, logic modules in PLDs have conventionally included only one register per combinational output from a combinational logic generator, such as a Look Up Table or LUT), in the module. These logic modules have therefore been conventionally been limited to: (i) generating a single non-registered combinational function; (ii) generating a single a registered combinational function; (iii) generating a single non-registered combinational function while the register was used for an unrelated flip flop operation; or (iv) use of the register only as a flip flop. Thus, with conventional logic modules, the output register could select from either the combinational output from the LUT, or some other input to the logic module, while driving either a global interconnect or an input to the LUT though a register feedback connection.

The conventional logic module as described above has become inadequate for a number of practical reasons. In many current user logic designs for PLDs, a large number of flip flops are often required for reasons such as pipelining, the use of shift registers to store data, etc. Furthermore, PLDs that use larger lookup tables such as 6 input functions exhibit a reduced ratio of flip flops to combinational logic because of the increased logic functionality of the 6 LUT compared to previous 4 LUT logic blocks. With designs that require many flip flops, it is possible to use a given logic module to implement both a combinational logic function in the LUT and separately use the output register for some other flip flop operation. This implementation, however, is typically undesirable. It often causes placement constraints, which negatively affect the speed of the design. As a result, the logic module is typically used to implement either a combinational function or a flip flop function, but not both functions. Consequently, efficiency is detrimentally effected as more logic modules may be needed than ordinarily required to implement the number of combinational and flip flop functions specified for a given logic design. Even when a user's design defines a smaller number of flip flops as compared to combinational functions, the actual implementation may require the use of a larger number of logic modules than otherwise required since some of the modules may be dedicated only for flip flop functions.

A PLD that has more flip flops per logic module by providing (i) more registered outputs than combinational outputs; and/or (ii) a combinational output that can drive more than one output register, is therefore needed.

SUMMARY OF THE INVENTION

A PLD that has more flip flops per logic module by providing more registered outputs than combinational outputs; and/or a combinational output that can drive more than one register is disclosed. The PLD includes a plurality of logic array blocks arranged in an array and a plurality of inter-logic array block lines interconnecting the logic array blocks of the array. At least one of the logic array blocks includes at least one logic module that includes a first combinational element configured to generate a first combinational output signal in response to inputs provided to the one logic module, a first register capable of being driven by the first combinational output signal and a second register capable of being driven by the first combinational output signal. The logic module therefore has more registered outputs than combinational outputs and a combinational output that can drive more then one output register. In alternative embodiments, the logic module may have one or more combinational element configured to generate one or more combinational output signals in response to inputs provided to the one logic module and a plurality of registers capable of being driven by the one or more combinational outputs signals. In these alternative embodiments, the number of registers exceeds the number of combinational output signals in the one logic module.

BRIEF DESCRIPTION OF THE DRAWINGS

The invention may best be understood by reference to the following description taken in conjunction with the accompanying drawings, which illustrate specific embodiments of the present invention.

It should be noted that like reference numbers refer to like elements in the figures.

DETAILED DESCRIPTION OF SPECIFIC EMBODIMENTS

The present invention will now be described in detail with reference to a various embodiments thereof as illustrated in the accompanying drawings. In the following description, specific details are set forth in order to provide a thorough understanding of the present invention. It will be apparent, however, to one skilled in the art, that the present invention may be practiced without using some of the implementation details set forth herein. It should also be understood that well known operations have not been described in detail in order to not unnecessarily obscure the present invention. Further, it should be noted that the techniques of the present invention could be applied to a variety of systems or electronic devices such as programmable devices and application-specific integrated circuit (ASIC) devices.

Figure 1:
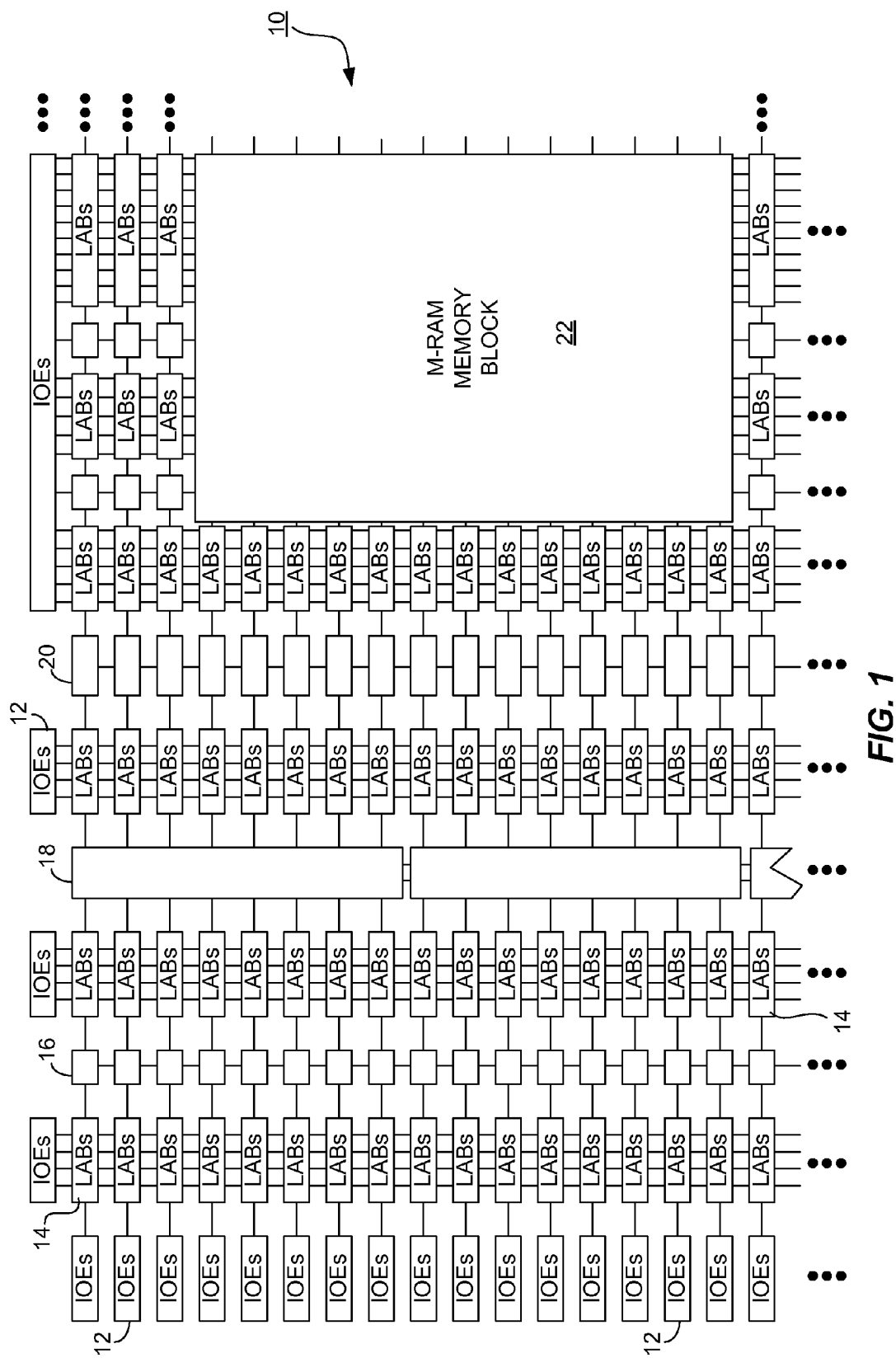
FIG. 1 is a block diagram of a Programmable Logic Device (PLD) architecture in accordance with one embodiment of the present invention.

Referring to FIG. 1, a block diagram of a Programmable Logic Device (PLD) according to one embodiment of the present invention is shown. The PLD 10 includes a two dimensional row and column based architecture including a plurality of Input/Output elements (IOEs) 12 arranged around the periphery of the chip, a plurality of Logic Array Blocks (LABs) 14 grouped into rows and columns across the device, Random Access Memory (RAM) blocks 16 grouped into columns between certain LABs 14, Digital Signal Processing (DSP) blocks 18 grouped into columns across the device, second RAM blocks 20 also grouped into columns across the device and between certain LABs 14, and one or more M-RAM memory blocks 22, each provided at different locations across the device.

The LABs 14 include a predetermined number of logic modules (not visible in the figure). In various embodiments, the number of logic modules may vary from two to sixteen or more. The RAM blocks 16 are simple dual port memory blocks with a predetermined number of bits and additional parity bits. The RAM blocks 16 provide dedicated simple dual port or single port memory for the device. The DSP blocks 18 are provided for performing digital signal processing functions, such as for example, finite impulse response (FIR) and infinite impulse response (IIR) filters. The second RAM blocks 20 are true dual port memory blocks with memory bits and parity bits. Finally, the M-RAM memory blocks 22 are large true dual port memory blocks with both memory and parity bits. It should be noted that the PLD 10 is merely exemplary and in no way should be construed as limiting the invention. It should also be noted that the practice of the present invention, as described herein, does not require a PLD with all the above-mentioned functional blocks, listed above. Functional blocks such as the RAM blocks 16, DSP blocks 18, RAM blocks 20 and M-RAM blocks 22 are optional and are not required for the practice of the present invention.

Figure 2:
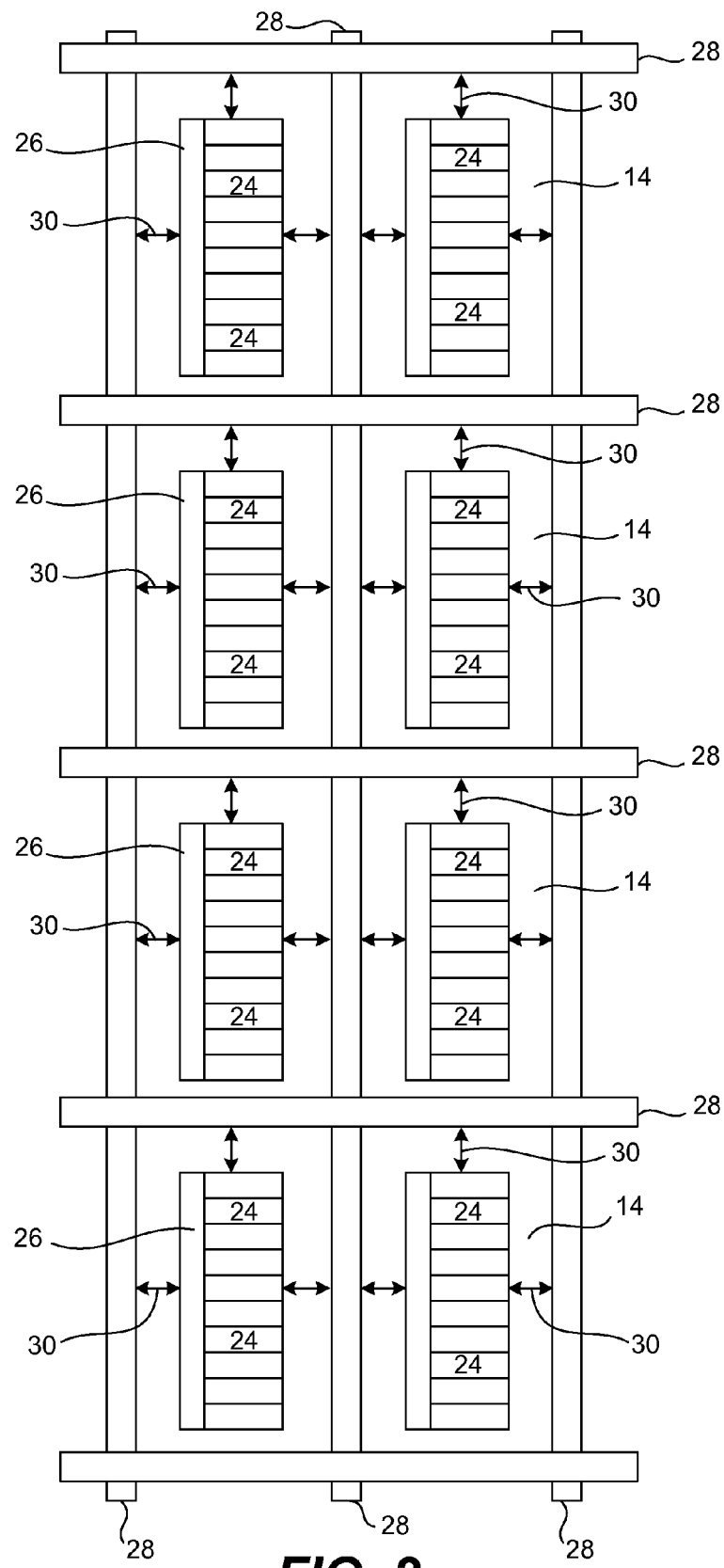
FIG. 2 is a diagram of a number of LABs interconnected by a plurality of vertical and horizontal inter-LAB lines according to the present invention.

Referring to FIG. 2, a block diagram of a number of LABs interconnected by a plurality of vertical and horizontal inter-LAB lines according to the present invention is shown. Each LAB 14 includes a plurality of logic modules 24. Local intra-LAB lines 26 are used to interconnect the individual logic modules 24 within each LAB 14. Vertical and horizontal inter-LAB lines 28 are used to interconnect the LABs 14 of the array. Routing drivers 30 (designated by double-sided arrows in the figure) are used to provide routing between the inter-LAB lines 28 and the local intra-LAB lines 26 of each LAB 14 respectively.

For more information on the specific PLD architecture 10 illustrated in FIGS. 1 and 2, see for example "The Stratix Architecture, Functional Description," pages 2-1 through 2-140, from the Altera Corporation, July, 2005 or "The Stratix® PII Architecture, Functional Description," pages 2-104, The Stratix® II Device handbook, Volume 1, December 2005, both incorporated by reference herein for all purposes.

Figure 3:
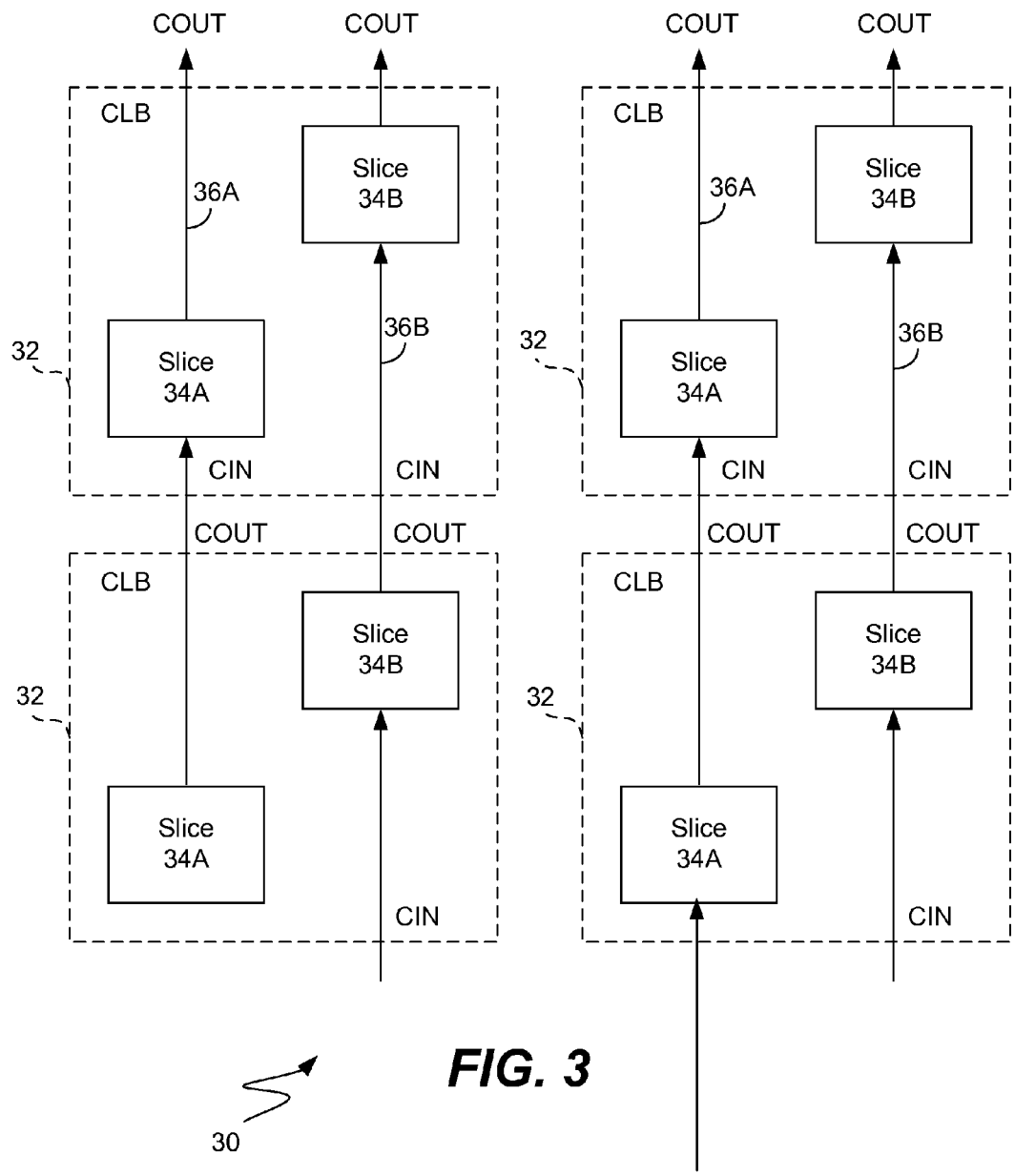
FIG. 3 is a block diagram of a second PLD architecture in accordance with another embodiment of the present invention.

Referring to FIG. 3, a block diagram of a programmable logic device (PLD) according to a second embodiment of the present invention is shown. The PLD 30 includes a plurality of Complex Logic Blocks (CLBs) 32 arranged in an array of rows and columns. Each CLB 32 includes a first slice 34A and a second slice 34B. The slices 34A of the CLBs 32 in a given column are interconnected by a first carry chain 36A, as designated by the carry-in (Cin) and carry-out (Cout) lines received and generated by the slices 34A. Similarly, the slices 34B are interconnected by a second carry chain 36B, as designated by the carry-in (Cin) and carry-our (Cout) lines received and generated by the slices 34B. Although not illustrated, the individual CLBs 32 are interconnected by a plurality of inter-CLB lines, as is well known in the art. For more details on CLB based PLDs having slices, see for example the "Virtex-5 User Guide", UG190 (v3.0), Feb. 2, 2007, published by Xilinx Corporation, San Jose, Calif., pages 155-181, incorporated by reference herein for all purposes.

Each slice 34 includes one or more logic modules (not illustrated). In one specific embodiment, each slice 34 includes four logic modules. In other embodiments, either more or fewer logic modules may be used per slice 34. In alternative embodiments for example, one to three, or five through sixteen or more logic modules may be included per CLB 34. In general, the specific number of logic modules in a CLB is arbitrary, and should not be construed as limiting in any way.

Figure 4:
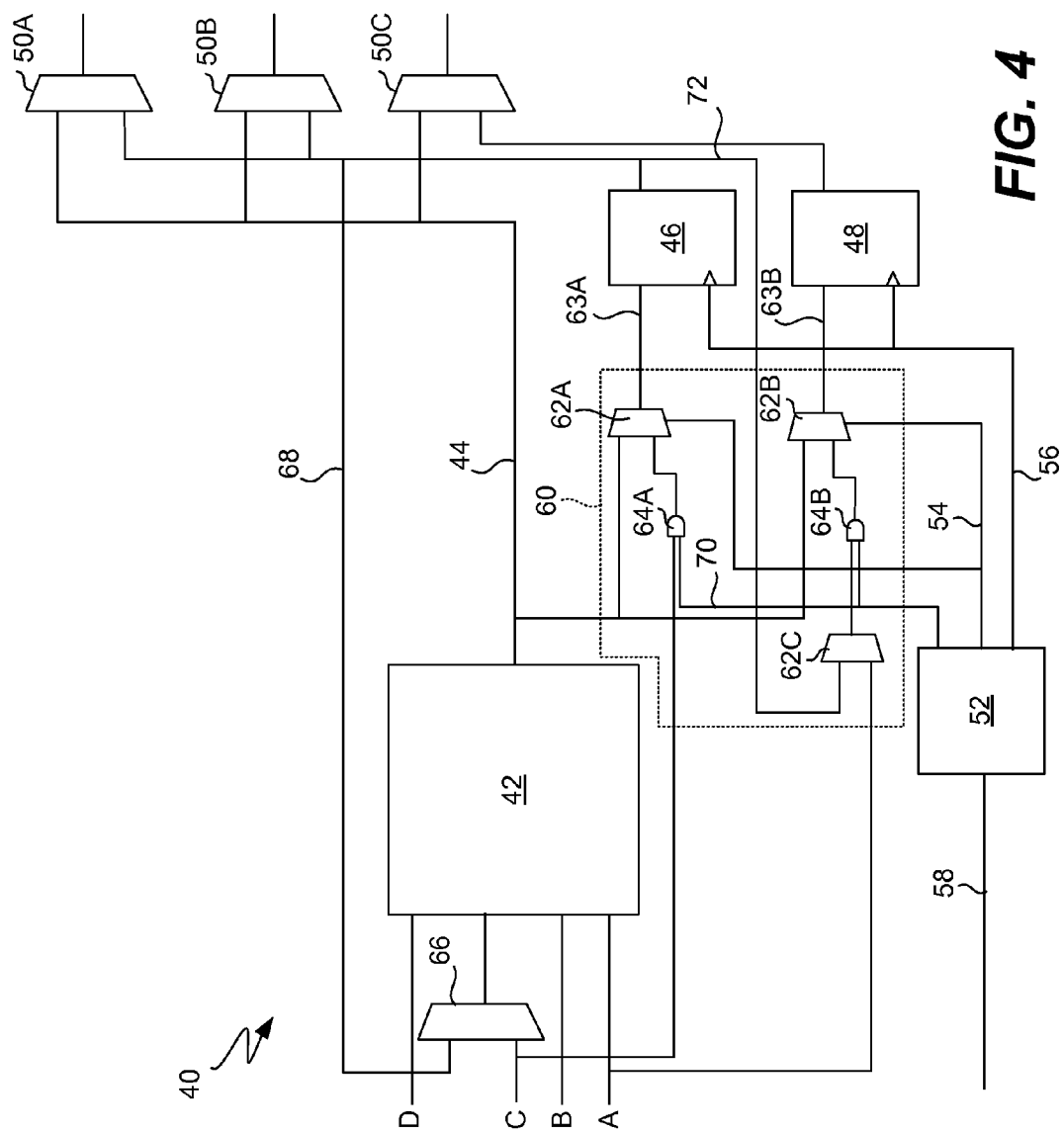
FIG. 4 is a logic module used in a logic array block according to one embodiment of the present invention.

Referring to FIG. 4, a logic module used in a logic array block according to one embodiment of the present invention is shown. The logic module 40 includes a combinational element 42 configured to receive inputs A, B, C and D and to generate a first combinational output 44, a first register 46, a second register 48, a plurality of output multiplexers 50A, 50B and 50C, a control signal selection circuit 52 configured to generate a register control signal 54 and a register clock signal 56 in response to one or more inputs control signals 58, and data generation logic 60 which includes three multiplexers 62A-62C and two AND gates 64A and 64B.

In the embodiment shown, the third input to the combinational element 42 is provided through multiplexer 66, which is coupled to receive the C input or the output of first register 46 through register feedback path 68. Depending on the select input provided to the multiplexer 66, either the C input or the register feedback signal is provided to the combinational element 42. It should be noted that the multiplexing of the C input is arbitrary and that any of the other inputs A, B or D could be multiplexed with the register feedback signal 68 as well.

During operation, the combinational element 42 generates combinational output 44 in response to a set of inputs, (A, B, C, D) or A, B, register feedback signal 68, D). The logic module 40 can generate either registered or non-registered outputs. In other words, the combinational output 44 can be outputted either directly through output multiplexers 50A-50C or through the registers 46 and/or 48 and then through the output multiplexers 50A-50C.

In the non-registered mode, combinational output 44 is provided directly to each of the multiplexers 50A-50C. By selecting the direct input to each of the multiplexers 50A-50C, the non-registered output 44 can be selectively coupled to inter-logic array block lines or local logic array block lines within the logic block that contains the logic module 40. Again, the number and particular arrangement of multiplexers 50A-50C shown is arbitrary and other configurations may be used.

In the registered output mode, the combinational output 44 is provided to the first register 46 and/or the second register 48 through the data generation logic 60. Specifically, the first register 46 is configured to receive at its data input 63A either: (i) the combinational output 44: or (ii) input C through multiplexer 62A. The second register 48 is configured to receive at its data input either: (i) the combinational output 44, (ii) input signal A through multiplexers 62B and 62C, or (iii) the cascaded output 72 of the first register 46, also through multiplexers 62B and 62C. The select input of both multiplexers 62A and 62B is controlled by the register control signal 54 generated by the control signal selection circuit 52, while the select input of multiplexer 62C is controlled by a configuration bit (not shown). In various embodiments, the one or more control signals 58 provided to the control signal selection circuit 52 is selected from the group including, but not limited to, a clock signal, a clock enable signal, a synchronous load signal, an asynchronous load signal, a synchronous clear signal, or an asynchronous clear signal.

The first register 46 and the second register 48 can also both be cleared by the control signal selection circuit 52. By driving the clear signal 70 low and setting the register control signal 54 to select the second input to each of the multiplexers 62A and 62B, the control signal selection circuit 52 causes the outputs of AND gates 64A and 64B to be low and provided to the data inputs of registers 46 and 48 respectively.

The outputs of the registers 46 and 48, in the embodiment shown, are partitioned among the multiplexers 50A-50C. For example, the output of the first register is applied to the multiplexers 50A and 50B, but not 50C. The output of the second register 48 is provided only to the multiplexer 50C, but not 50A and 50B. The registered combinational output can therefore be selectively coupled to inter-logic array block lines or local logic array block lines within the logic block that contains the logic module 40 through multiplexers 50A-50C. The two registers 46 and 48 may also drive distinct subsets of the inter-logic array block routing. Specifically, in order to reduce the costs of the multiplexers 50A-50C that drive the inter-logic array block routing, the multiplexers 50A-50C may be restricted in their inputs to only selecting from one of the registers 46 or 48.

The logic module 40 provides a number of advantages and is more flexible than prior art modules. For example, the logic module 40 is capable of (i) providing two registered outputs of the combinational output 44; (ii) providing one registered output of the combinational output 44 and using the other register for a flip flop operation; (iii) providing two non-registered outputs of the combinational output 44 and using either one or both of the registers 46 and 48 for unrelated flip flop operations; or (iv) just using one or both of the two registers 46 and 48 for flip flop operations.

In one embodiment of the invention as illustrated in FIG. 4, the two registers 46 and 48 share the same control signal selection logic 52 to reduce costs. In alternative embodiments, however, separate control logic can be used. In addition, at least some distinct data generation logic in circuit 60 as described above is necessary to provide a unique data input to each register 46 and 48 as described above. Another useful attribute is that distinct input signals A-C to the logic module 40 or the combinational output may be provided as load data to either register 46 or 48. Thus, both registers 46 and 48 can be loaded with the same logic module input A-C (provided that the signal is available on both A and C) or combinational output so that two identical copies of a flip flop can be provided, allowing a single logical flip flop to drive onto all routing outputs. Thus although the routing flexibility of an individual flip flop is less than the conventional case, by duplicating the flip flop in the common case of using a single flip flop per logic element, the full routing flexibility of the conventional case is available. Yet another feature is the ability for one register 46 to load as data the output of the other register 48, forming a shift register.

With the logic module 40 of FIG. 4, the two registers 46 and 48 are both capable of being driven by the one combinational output signal 44. Thus, in this embodiment, the number of registers in the logic module 40 exceeds the number of combinational output signals by a ratio of (2:1). It should be noted, however, that this ratio is arbitrary. In other embodiments, the number of registers and combinational outputs per logic module may vary. For example, different embodiments of logic modules 40 with register(s)- to-combinational output(s) ratio may include 3:1, 3:2, 4:1, 4:2, 4:3, 5:1, 5:2, 5:3, or 5:4 for example. Although too numerous to discuss all the various embodiments listed above in detail herein, a logic module with a ratio of three registers versus two combinational outputs (3:2) is described below as an example.

Figure 5:
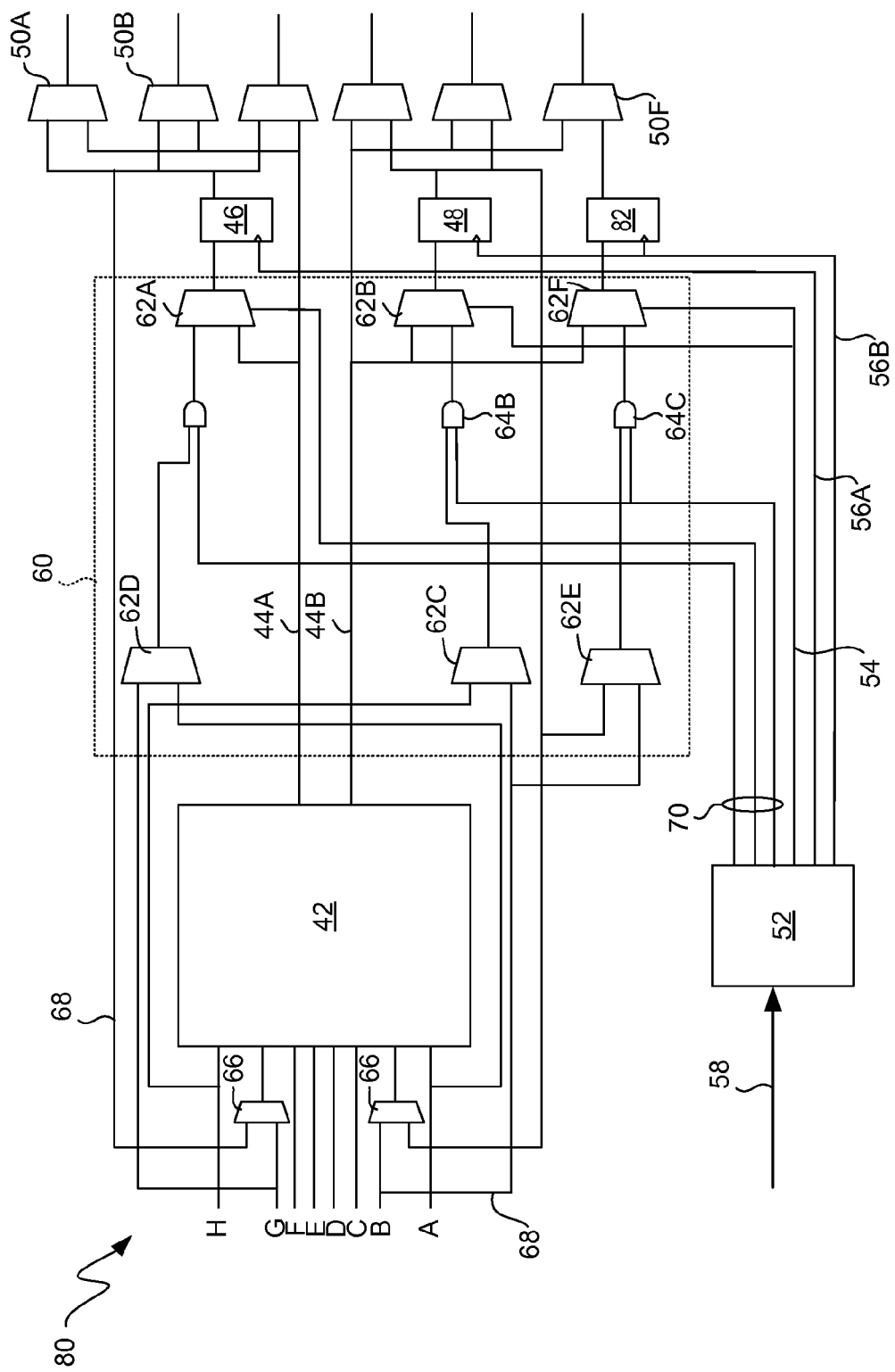
FIG. 5 is a logic module used in a logic array block according to a second embodiment of the present invention.

Referring to FIG. 5, a logic module used in a logic array block according to a second embodiment of the present invention is shown. In this embodiment, the logic module 80 is similar to the module 40, except that it includes: (i) a combinational element 42 that generate first and second combinational outputs 44A and 44B; (ii) a third register 82 in addition to registers 46 and 48; (iii) additional multiplexers 62E and 62F and AND gate 64C in the data generation logic 60, and (iv) additional output multiplexers 50D-50F. The combinational element 42 is configured to receive inputs A-H. The registers 46, 48 and 82 are each configured to receive one of the combinational output signals 44A or 44B, one of the input signals A, B, G or H, or a clear signal. The combinational output signals 44A and 44B, either registered or non-registered, are partitioned among the plurality of output multiplexers 50A-50F. Otherwise, like reference numbers refer to like elements, and therefore are not discussed in detail herein. In the embodiment shown, the register 46 is configured to receive only the first combinational output 44A, but not the second combinational output 44B. The registers 48 and 82, however, are each configured to receive only the second combinational output 44B, but not the first combinational output 44A.

The logic module 80 provides the same features and advantages as described above with regard to FIG. 4, except with the additional benefit of a third register 82, thus providing even a higher degree of efficiency and flexibility. The use of three registers per two combinational outputs provides a ratio of flip flops to combinational logic that is higher than the conventional case, while lower than providing two flip flops per combinational output.

In other embodiments, the number of combinational elements and the number of combinational output signals they generate may vary. For example, a logic module may include anywhere from one to four or more combinational elements 42 which are capable of generating one, two, three, four or more combinational outputs 44.

While the invention has been particularly shown and described with reference to specific embodiments thereof, it will be understood by those skilled in the art that changes in the form and details of the disclosed embodiments may be made without departing from the spirit or scope of the invention. It is therefore intended that the invention be interpreted to include all variations and equivalents that fall within the true spirit and scope of the present invention.

What is claimed is:

1. An apparatus, comprising:
    a programmable logic device, the programmable logic device including:
        a plurality of logic array blocks arranged in an array;
        a plurality of inter-logic array block lines interconnecting the logic array blocks of the array,
    wherein at least one of the logic array blocks further includes at least one logic module, the one logic module including:
        a first combinational element configured to generate a first combinational output signal in response to inputs provided to the one logic module;
        a first register capable of being driven by the first combinational output signal;
        a second register capable of being driven by the first combinational output signal; and
    a third register capable of being driven by a second combinational output signal generated by the first combinational element.

2. The apparatus of claim 1, wherein the one logic module further comprises a second combinational element configured to generate a second combinational output signal, wherein the first register is capable of being driven by either the first combinational output signal or the second combinational output signal.

3. The apparatus of claim 1, wherein the one logic module further comprises a second combinational element configured to generate a second combinational output signal, wherein the first register is capable of being driven by either the first combinational output signal or the second combinational output signal and the second register is capable of being driven only by the first combinational output signal.

4. The apparatus of claim 1, wherein the one logic module further comprises a control signal selection circuit configured to generate a register control signal to control the first register and the second register respectively.

5. The apparatus of claim 4, wherein the control signal selection circuit is configured to generate the register control signal in response to one or more control signals provided to the one logic module.

6. The apparatus of claim 5, wherein the one or more control signals provided to the one logic module is/are selected from the group consisting of: a clock signal, a clock enable signal, a synchronous load signal, an asynchronous load signal, a synchronous clear signal and an asynchronous clear signal.

7. The apparatus of claim 1, wherein an output of the first register is programmably cascaded as an input to the second register.

8. The apparatus of claim 1, wherein the one logic module further comprises a plurality of output multiplexers coupled to outputs of the first register and the second register respectively.

9. The apparatus of claim 8, wherein the outputs of the first register and the second register are partitioned among the plurality of output multiplexers.

10. The apparatus of claim 8, wherein the output multiplexers selectively couple the outputs of the first register and the second register to either one of the inter-logic array block lines, a logic array block line local to the one logic array block, or both.

11. The apparatus of claim 1, wherein the one logic module further comprises data generation logic to provide a first data input and a second data input to the first register and the second register respectively.

12. The apparatus of claim 11, wherein the first data input and the second data inputs are inputs provided to the one logic module.

13. The apparatus of claim 12, wherein the first data input and the second data input provided to the first register and the second register are either the same data input or two different data inputs to the one logic module.

14. The apparatus of claim 1, wherein the first register is capable of being driven by one of the following:
    (i) the first combinational output signal;
    (ii) an input signal provided to the one logic module; or
    (iii) a clear signal.

15. The apparatus of claim 1, wherein the second register is capable of being driven by one of the following:
    (i) the first combinational output signal;
    (ii) an input signal provided to the one logic module; or
    (iii) a clear signal.

16. An apparatus, comprising:
    a programmable logic device, the programmable logic device including:
        a plurality of logic array blocks arranged in an array;
        a plurality of inter-logic array block lines interconnecting the logic array blocks of the array,
    wherein at least one of the logic array blocks further includes at least one logic module, the one logic module including:
        one or more combinational element configured to generate one or more combinational output signals in response to inputs provided to the one logic module; and
        a plurality of registers capable of being driven by the one or more combinational outputs signals,
    wherein the number of registers exceeds the number of combinational output signals in the one logic module.

17. The apparatus of claim 16, wherein number of registers versus the number of combinational output signals in the one logic module is defined by one of the following ratios: 2:1, 3:1, 3:2, 4:1, 4:2, 4:3, 5:1, 5:2, 5:3 or 5:4 respectively.

18. The apparatus of claim 17, wherein the one or more combinational elements further consists one of the following:
    (i) a first combinational element configured to generate a first combinational output signal;

(ii) a first combinational element configured to generate a first combinational output signal and a second combinational output signal;

(iii) a first combinational element configured to generate a first combinational output signal and a second combinational output signal and a second combinational element configured to generate a third combinational signal; and (iv) a first combinational element configured to generate a first combinational output signal and a second combinational output signal and a second combinational element configured to generate a third combinational output signal and a fourth combinational output signal.

19. The apparatus of claim 17, wherein the plurality of registers capable of being driven by the one or more combinational outputs signals consists one of the following:

(i) two registers in the one logic module;

(ii) three registers in the one logic module;

(iii) four registers in the one logic module; or (iv) five registers in the one logic module.

20. The apparatus of claim 17, wherein the one logic module further comprises:

a first combinational element configured to generate a first combinational output signal;

a first register capable of being driven by the first combinational output signal; and a second register capable of being driven by the first combinational output signal.

21. The apparatus of claim 20, wherein the first combinational element is further configured to generate a second combinational output signal and the one logic element further comprises a third register capable of being driven by either the first combinational output signal or the second combinational output signal.

22. The apparatus of claim 17, wherein the one logic module further comprises a control signal selection circuit configured to generate a plurality of register control signals to control the plurality of registers respectively.

23. The apparatus of claim 22, wherein the control signal selection circuit is configured to generate the plurality of register control signals in response to one or more control signals provided to the one logic module.

24. The apparatus of claim 23, wherein the one or more control signals provided to the one logic module is/are selected from the group consisting of: a clock signal, a clock enable signal, a synchronous load signal, an asynchronous load signal, a synchronous clear signal and an asynchronous clear signal.

25. The apparatus of claim 17, wherein the plurality of registers can be programmably cascaded together so that an output of one register is provided to an input of a second register.

26. The apparatus of claim 17, wherein the one logic module further comprises a plurality of output multiplexers coupled to outputs of the plurality of registers respectively.

27. The apparatus of claim 26, wherein the outputs of the plurality of registers are partitioned among the plurality of output multiplexers respectively.

28. The apparatus of claim 27, wherein the plurality of output multiplexers selectively couple the outputs of the plurality of the registers to either one of the inter-logic array block lines or a logic array block line local to the one logic array block respectively.

29. The apparatus of claim 17, wherein the one logic module further comprises data generation logic to provide one or more data inputs to the plurality of registers respectively.

30. The apparatus of claim 17, wherein each of the plurality of registers is capable of being driven by one of the following:

(i) one or more of the combinational output signals;

(ii) an input signal provided to the one logic module; or a clear signal.

* * * * *